United States Patent
Takahashi et al.

(10) Patent No.: US 8,431,515 B2
(45) Date of Patent: Apr. 30, 2013

(54) TAPE-SHAPED OXIDE SUPERCONDUCTOR

(75) Inventors: Yasuo Takahashi, Tokyo (JP); Tsutomu Koizumi, Tokyo (JP); Yuji Aoki, Tokyo (JP); Atsushi Kaneko, Tokyo (JP); Takayo Hasegawa, Tokyo (JP)

(73) Assignees: International Superconductivity Technology Center, The Juridical Foundation (JP); SWCC Showa Cable Systems Co., Ltd. (JP)

( * ) Notice: Subject to any disclaimer, the term of this patent is extended or adjusted under 35 U.S.C. 154(b) by 585 days.

(21) Appl. No.: 12/601,992

(22) PCT Filed: May 7, 2008

(86) PCT No.: PCT/JP2008/001149
§ 371 (c)(1),
(2), (4) Date: Nov. 25, 2009

(87) PCT Pub. No.: WO2008/152768
PCT Pub. Date: Dec. 18, 2008

(65) Prior Publication Data
US 2010/0197506 A1   Aug. 5, 2010

(30) Foreign Application Priority Data
Jun. 12, 2007   (JP) ................. 2007-155484

(51) Int. Cl.
*H01L 39/24* (2006.01)
(52) U.S. Cl.
USPC ........................................ 505/238; 505/237

(58) Field of Classification Search ............ 505/237, 505/238
See application file for complete search history.

(56) References Cited

U.S. PATENT DOCUMENTS

| | | | |
|---|---|---|---|
| 6,537,689 B2 * | 3/2003 | Schoop et al. | 428/701 |
| 2002/0076567 A1 | 6/2002 | Honjo et al. | 428/469 |
| 2005/0217568 A1 * | 10/2005 | Rupich et al. | 117/101 |
| 2005/0239659 A1 * | 10/2005 | Xiong et al. | 505/300 |
| 2007/0170428 A1 | 7/2007 | Hahakura et al. | 257/57 |

FOREIGN PATENT DOCUMENTS

| | | |
|---|---|---|
| JP | 04-329867 | 11/1992 |
| JP | 04-331795 | 11/1992 |
| JP | 2005-113220 | 4/2005 |
| JP | 2007-115561 | 5/2007 |

* cited by examiner

*Primary Examiner* — Paul Wartalowicz
(74) *Attorney, Agent, or Firm* — Bacon & Thomas, PLLC

(57) ABSTRACT

A tape-shaped oxide superconductor includes a 15 to 100 nm-thick Ce—Gd—O-based oxide layer (Ce:Gd=40:60 to 70:30 molar ratio) and a 100 nm-thick Ce—Zr—O-based oxide layer (Ce:Zr=50:50 molar ratio) as first and second intermediate layers are formed by MOD on an Ni-base alloy substrate having a half value width (FWHM:$\Delta\phi$) of 6.5 degrees. A 150 nm-thick $CeO_2$ oxide layer as a third intermediate layer is formed on the second intermediate layer by RF sputtering. A 1 μm-thick YBCO superconducting layer is formed by TFA-MOD on the three-layer structure. In the tape-shaped oxide superconductor, the $\Delta\phi$ values of the first to third intermediate layers are (6.0 to 6.5) degrees, (6.0 to 6.6) degrees, and (6.0 to 6.6) degrees, respectively, and the Jc value of the YBCO superconducting layer in liquid nitrogen is 1.8 to 2.2 $MA/cm^2$.

14 Claims, 3 Drawing Sheets

TAPE-SHAPED OXIDE SUPERCONDUCTOR

TECHNICAL FIELD

This invention relates to an oxide superconductor which is suitable to the usage for an electric power cable, an electric power device such as an electric power storage system, and a power application product such as a motor and a transformer. In particular, this invention relates to a tape-shaped oxide superconductor which is suitable to a film formation method, that is, an organic metallic salt coating thermal decomposition (MD) method that a ceramics thin layer is formed onto a metallic substrate by heating and baking a precursor film.

BACKGROUND ART

As for the oxide superconductor, a critical temperature (Tc) is high compared with a conventional metal system, superconductor such as $Nb_3Sn$ system, and the electric power cable, and applied equipments such as transformer, motor, and electric power storage system can be operated under the liquid nitrogen temperature. Therefore, the making of the wire rod is studied energetically. Especially, in $RE_3Ba_2Cu_3O_{7-y}$ (here, $RE_3$ shows any one kind or more than two kinds of elements selected from Y, Gd, Sm, Nd, Ho, Dy, Eu, Tb, Er, Yb, and hereinafter called $RE_3BCO$) superconductor, because the attenuation of the conducting current is small in the high magnetic field area, that is, because the magnetic-field property in the liquid nitrogen temperature is excellent compared with Bi system superconductor, the practical high critical current density (Jc) can be maintained. And, in addition to the excellent property in the high temperature area, because the manufacturing method which does not use silver of the precious metal is possible and the liquid nitrogen can be used as the refrigerant, the cooling efficiency improves remarkably. Therefore, it is extremely advantageous economically and the making of the wire rod is expected as the next-generation superconducting material.

Generally, the $RE_3BCO$ oxide superconducting wire rod has the structure that at least one layer or a plurality of layers of the biaxially-oriented oxide layer are formed onto the metallic substrate, and the oxide superconducting layer is formed onto it, and further, the stabilizing layer which undertakes the role as the surface protection of the superconducting layer, the improvement of the electric contact, and the protection circuit at the time of the excessive energization is stacked. In this case, it is known that the critical current property of the $RE_3BCO$ wire rod depends on the in-plane orientation of the superconducting layer, and is influenced greatly by the intermediate layer which becomes the basic material and by the in-plane orientation and the smooth surface property of the oriented metallic substrate.

The crystal system of the $RE_3BCO$ oxide superconductor is the rhombic crystal, and because the lengths of three sides of x axis, y axis and z axis are different and the angles among the three sides of the unit cell are also slightly different respectively, it is easy to form the twin crystal. And because the slight gap of the azimuth generates the twin crystal grain boundary and reduces the conducting property, to bring out the property of the material in the conducting state, in addition to alignment of the CuO face of the inside of the crystal, the alignment of the crystal orientation in the in-plane also is demanded. Therefore, the making of the wire rod has the difficulty compared with the Bi system oxide superconductor.

The manufacturing method of the making of the wire rod which improves the in-plane orientation of the crystal of the $RE_3BCO$ oxide superconductor and aligns the azimuth direction in the in-plane is same as the manufacturing method of the thin film. That is, the intermediate layer whose in-plane orientation and azimuth direction are improved is formed onto the tape-shaped metallic substrate, and the crystal lattice of this intermediate layer is used as the template. And thereby, the in-plane orientation and the azimuth direction of the crystal of the $Re_3BCO$ oxide superconducting layer are improved.

The $RE_3BCO$ oxide superconductor is studied in various manufacturing processes now, and various biaxially-oriented composite substrates which form the in-plane oriented intermediate layer onto the tape-shaped metallic substrate are known.

Among these, at present, the process which shows the highest critical current property is a method of using the IBAD (Ion Beam Assisted Deposition) substrate. In this method, onto the polycrystalline non-magnetic and high strength tape-shaped Ni system substrate (hastelloy etc.), the particle generated from the target while irradiating the ion from a direction of the constant angle for the normal line of this Ni system substrate is deposited by pulsed laser deposition (PLD) method. And, the intermediate layer ($CeO_2$, $Y_2O_3$, YSZ etc.) or the intermediate layer of the double-layered structure (YSZ or $RxZr_2O_7/CeO_2$ or $Y_2O_3$ etc.: Rx shows Y, Nd, Sm, Gd, Eu, Yb, Ho, Tm, Dy, Ce, La or Er) which has the fine grain size and the high orientation and inhibits the reaction with the element which composes the superconductor is formed. And, after forming the $CeO_2$ film onto it by PLD method, in addition, $YBa_2Cu_3O_{7-y}$ (hereinafter called YBCO) layer is formed by PLD method or CVD method, and the superconducting wire rod is formed (for example, refer to Patent document No. 1 to No. 3).

However, in this process, because all intermediate layers are formed by the vacuum process in the gas phase method, although this process has the advantage that the dense and smooth intermediate layer film can be obtained, there are problems that the production speed is slow and the production cost rises. Although the processes of forming films by using some gas phase methods other than this IBAD method have been studied, the effective means which solve the problems of the production speed and the production cost have not been reported.

The most effective process for attaining the low cost is the MOD process where the organic acid salt or the organic metallic compound is used as the raw material and the oxide layer is formed by giving the thermal decomposition and the crystallization heat-treatment after coating this solution onto the surface of the substrate. Although this process is simple, because the long time heat-treatment in high temperature is necessary, by the generation of cracks due to the contraction in volume of film at the time of the thermal decomposition, the non-uniform reaction by the imperfect of grain growth, and the decrease of the crystalline by such as the diffusion through the crystal grain boundary of the metallic element which composes the substrate, it was difficult to obtain the film having the function enough as the intermediate layer.

Generally, as the intermediate layer of the superconductor, especially in the case of YBCO, although $CeO_2$ which is formed by PVD method is used as described above, because $CeO_2$ intermediate layer is excellent in the lattice consistency with the YBCO layer and in the oxidation resistance, and because the reactive property with the YBCO layer is small, this depends on what is known as one of the most excellent intermediate layer. When this $CeO_2$ intermediate layer is formed by MOD method, the cracks are generated due to the large difference of the coefficient of thermal expansion with the metal of the substrate, and it becomes impossible to accomplish the function as the intermediate layer. When the film is formed by MOD method onto the Ni substrate by the solid solution that Gd is added to $CeO_2$, although the generation of cracks is inhibited by being able to alleviate the difference of the coefficient of thermal expansion, because the diffusion of the element from Ni or Ni alloy substrate cannot be stopped in the inside of the intermediate layer, there was a problem that the superconducting property decreases.

In order to prevent the diffusion of the element which composes this substrate, the study of the intermediate layer material ($Ce_2Zr_2O_7$) that a part of $CeO_2$ is substituted to Zr is carried out. And for example, in the oxide superconductor that one layer or a plurality of layers of the biaxially-oriented intermediate layer by the inorganic material is formed and the oxide superconducting layer is provided onto this, by providing the intermediate layer which includes one kind of element selected from Ce, Gd or Sm and Zr onto the above-mentioned substrate, the effect of preventing the diffusion to the superconducting layer of the metallic element which composes the substrate is admitted, and the property of $Jc>1MA/cm^2$ is obtained (refer to Patent application No. 2005-306696 and Patent application No. 2005-360788).

Patent document No. 1: Japanese Patent Publication No. Hei04-329867
Patent document No. 2: Japanese Patent Publication No. Hei04-331795
Patent document No. 3: Japanese Patent Publication No. 2002-203439

DISCLOSURE OF THE INVENTION

Problem to be Solved by the Invention

As described above, when the intermediate layer is formed by the material ($Ce_2Zr_2O_7$) that a part of $CeO_2$ is substituted to Zr, the effect of preventing the diffusion to the superconducting layer of the element which composes the metallic substrate is admitted. However, if the oxide layer which includes Zr is provided directly onto the metallic substrate, the orientation deteriorates 1-3 degrees than the metallic substrate. Therefore, because the orientation of the superconducting layer also deteriorates depending on this, there was a problem that the improvement of the superconducting property cannot expect. That is, in this system, it is difficult to equalize the in-plane orientations of the intermediate layer and the oxide superconducting layer which are important factor for improving Jc for the substrate, and thereby, there was a conclusion that the improvement of Jc of the superconducting layer was disturbed.

This invention was conducted to solve the above-described problems. And this invention as to provide the tape-shaped oxide superconductor which is excellent in the superconducting property by preventing the diffusion to the superconducting layer of the element which composes the metallic substrate, by preventing the generation of the cracks due to the difference of the coefficient of thermal expansion with the metal of the substrate, and by improving the orientation of the superconducting layer.

Means for Solving the Problems

The tape-shaped oxide superconductor of this invention was conducted to solve the above-described problems. In a tape-shaped oxide superconductor that an intermediate layer and a oxide superconducting layer are formed in series onto a biaxially-oriented metallic substrate, the intermediate layer is formed by three-layer structure which comprises a first intermediate layer which is formed onto the metallic substrate and comprises an oxide which has a template function, a second intermediate layer which is formed onto the first intermediate layer and comprises an oxide which has a function which prevents a diffusion to the oxide superconducting layer of an element which composes the metallic substrate, and a third intermediate layer which is formed onto the second intermediate layer and comprises an oxide which has a function which controls an orientation of the oxide superconducting layer.

In the above-described case, in order to succeed an in-plane orientation of a crystalline of a surface of the biaxially-oriented metallic substrate and improve the in-plane orientation of the oxide superconducting layer, it is preferable that the in-plane orientation from the first intermediate layer to the third intermediate layer are maintained within the range of ±1.0 degree for $\Delta\phi$ (FWHM: half value width) of the biaxially-oriented metallic substrate.

It is possible that the above-mentioned first intermediate layer and third intermediate layer are formed by $CeO_2$ or $Ce$—$RE_1$—$O$ (here, $RE_1$ shows any one kind or more than two kinds of elements selected from Gd, Sm, Eu, Dy, Ho, Er, and hereinafter it is same.).

Besides, it is possible that the second intermediate layer is formed by $RE_2$—$Zr$—$O$ (here, $RE_2$ shows any one kind or more than two kinds of elements selected frau Ce, Gd, Sm, Eu, Dy, Ho, Er, Y, and hereinafter it is same.)

It is preferable that the first and the second intermediate layers and the oxide superconducting layer are formed by an organic metallic salt coating thermal decomposition (MOD) method.

In this case, it is possible that these intermediate layer and oxide superconducting layer are formed by giving a heat-treatment after coating a mixed solution of an octylic acid salt, a naphthenate, a neodecanoic acid salt, or a trifluoroacetate which includes each element which composes the aforementioned intermediate layer or oxide superconducting layer with a predefined mole ratio.

Besides, in this invention, although the biaxially-oriented metallic substrate is used, it is necessary that this metallic substrate is provided with a biaxially-oriented surface layer in a side which contacts to at least the first intermediate layer. And, it is possible that the metallic substrate like this are obtained by giving a predefined heat-treatment after a cold rolling of Ni, Ni-base alloy, Cu, or Cu-base alloy.

Effect of the Invention

According to this invention, by providing the three-layer structured intermediate layers which have the particular functions respectively onto the biaxially-oriented metallic substrate, the first intermediate layer succeeds the in-plane orientation of the metallic substrate as the template of the metallic substrate, and the diffusion to the oxide superconducting layer of the element which composes the metallic substrate is prevented by the second intermediate layer which is stacked onto that, and further, the third intermediate layer controls the orientation of the oxide superconducting layer which is stacked onto that. Therefore, the diffusion of the element which composes the metallic substrate or the generation of the cracks in the intermediate layer can be prevented. Besides, it is possible that the in-plane orientation of the oxide superconducting layer is equally maintained with the metallic substrate, and the tape-shaped oxide superconductor which is excellent in the superconducting property can be obtained.

BEST MODE FOR CARRYING OUT THE INVENTION

Figure 3:
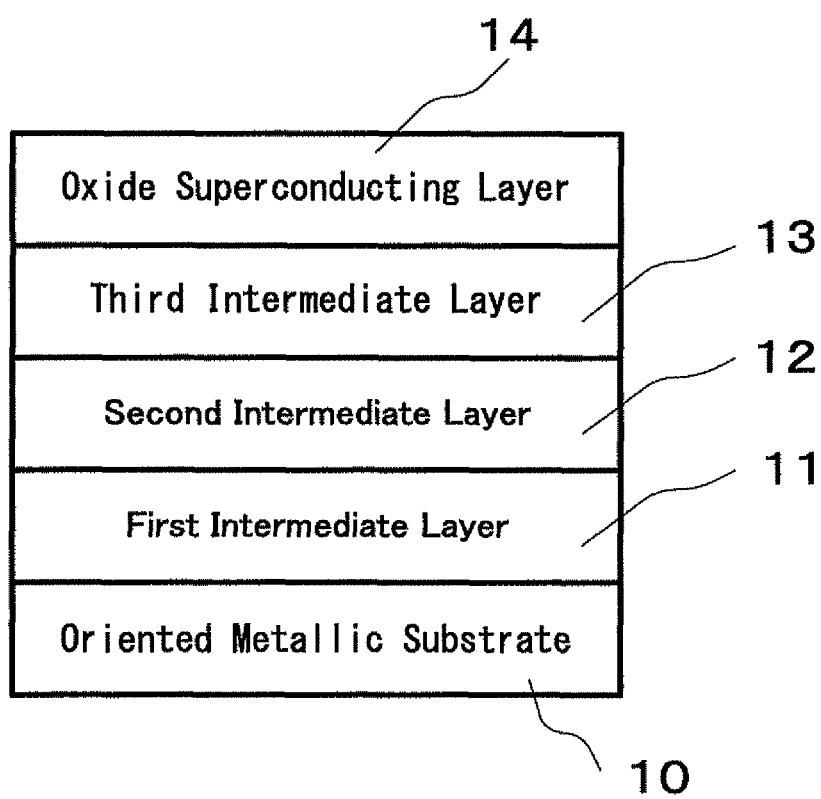
[FIG. 3] The schematic sectional view which is perpendicular to the axial direction of the tape which shows one embodiment of the structure of the tape-shaped oxide superconductor of this invention.

As shown in FIG. 3, the tape-shaped oxide superconductor of this invention has the structure that the first intermediate layer (template layer) 11 which has the equivalent orientation with the metallic substrate over the oriented metallic substrate 10 which has the biaxially-orientation, the second intermediate layer (diffusion preventing layer) 12 which prevents the diffusion of the metallic element which composes the oriented metallic substrate 10 to the oxide superconducting layer, and the third intermediate layer (orientation controlling layer) 13 which controls the orientation of the oxide superconducting layer and prevents the reactivity are stacked, since then, the superconducting layer 14 is provided onto this. Further, the stabilizing layer (not shown in drawing) which has the role of such as surface protection comprising such as silver may be provided onto the oxide superconducting layer 14.

Figure 2:
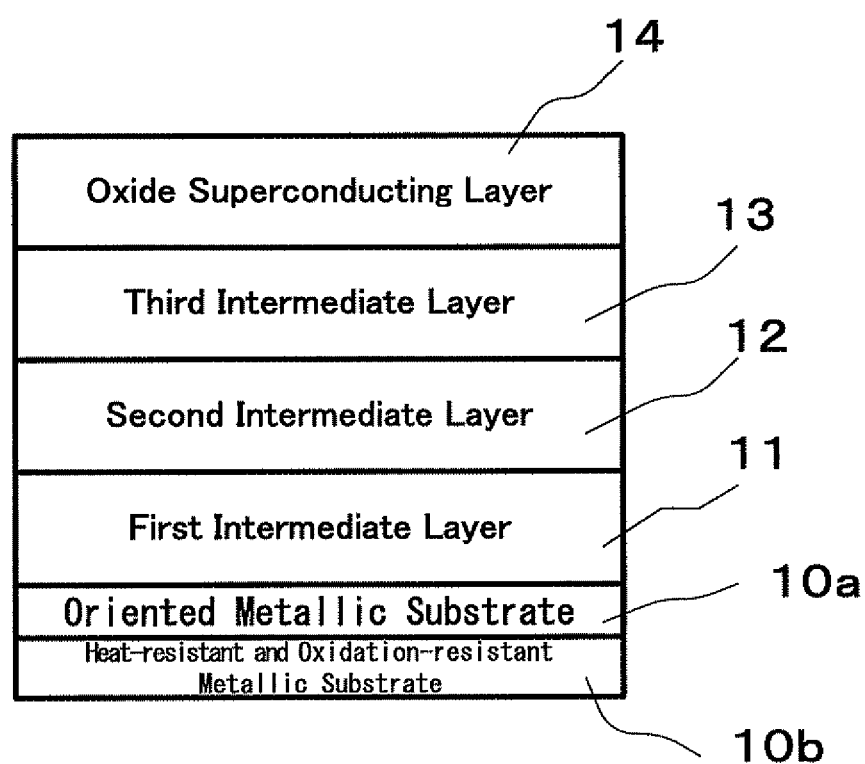
[FIG. 2] The schematic sectional view which is perpendicular to the axial direction of the tape which shows other embodiment of the tape-shaped oxide superconductor of this invention.

As for above-mentioned each intermediate layer 11, 12, 13, it is necessary to succeed the orientation of the crystalline of the biaxially-oriented oriented metallic substrate 10 for improving the in-plane orientation of the oxide superconducting layer 14. Therefore, as for the metallic substrate 10, it is necessary to provide the biaxially-oriented surface layer in the side which contacts to at least first intermediate layer. As the oriented metallic substrate like this, Ni, Ni-base alloy, Cu or Cu-base alloy that the predefined heat-treatment is given after cold rolling can be used. For example, Ni-base alloy which includes any one kind or more than two kinds of elements selected from (W, Mo, Ta, V, Cr) into Ni with 0.1-15 at % can be used. Besides, the composite metallic substrate which comprises the stacking structure that these oriented metallic substrate, the metallic substrate (hastelloy, inconel, stainless steel, etc.) which has the heat resistance and the oxidation resistance, and Ni, Ni-base alloy, Cu, or Cu base-alloy are attached together by the cold rolling and the heat-treatment for the orientation is given with the temperature of 90-1300 degrees C. can be also used. Instead of the oriented metallic substrate 1 which has the biaxially-orientation of FIG. 3, FIG. 2 shows the example of using the composite metallic substrate that the metallic substrate 10b which has the heat resistance and the oxidation resistance and the oriented metallic substrate 10a which has the biaxially-orientation are attached together.

It is preferable that the first intermediate layer 11 and the third intermediate layer 13 are formed by $CeO_2$ or $Ce$—$RE_1$—$O$. In this case, the mole ratio of $Ce:RE_1$ is within the range of $Ce:RE_1$=30:70-(100-α):α(α>0). And more preferably, it is within the range of $Ce:RE_1$=40:60-70:30. This reason is that the biaxially-orientation decreases when $Ce/RE_1$ ratio is smaller than 3/7.

It is preferable that the thickness of the first intermediate layer 11 is within the range of 10-100 nm. This reason is that when the film thickness is less than 10 nm, the metallic substrate cannot be coated perfectly and the effect of improving the orientation is not admitted, and on the other hand, when the film thickness exceeds 100 nm, the surface roughness increases, and the orientations of the second intermediate layer and the third intermediate layer and the superconducting property of the superconducting layer decrease remarkably.

Besides, it is preferable that the thickness of the third intermediate layer 13 is the range of 30 nm or more. When the film thickness is less than 30 nm, at the time of film formation of the superconducting layer, the superconducting layer and the third intermediate layer 13 react and disappears, therefore, the superconducting property decreases remarkably.

On the other hand, the second intermediate layer 12 can be formed by $RE_2$—$Zr$—$O$. In this case, it is preferable that the mole ratio of $RE_2:Zr$ is within the range of $RE_2:Zr$=30:70-70:30. It is preferable that the thickness of the second intermediate layer 12 is the range of 30 nm or more. When the film thickness is less than 30 nm, at the time of the film formation of the superconducting layer, because the interdiffusion between the alloy element which composes the metallic substrate 10 and the superconducting layer occurs, the superconducting property deteriorates remarkably.

As for the above-mentioned first to third intermediate layers and the oxide superconducting layer, it is possible to use any method such as the organic metallic salt coating thermal decomposition (MOD) method, the RF sputtering method, the pulsed laser deposition method, the EB method, and the CVD method if the above-mentioned oxide can be formed. However, from the above-mentioned reason, it is preferable to form the first and second intermediate layers and the oxide superconducting layer by the organic metallic salt coating thermal decomposition (MOD) method. In this case, these intermediate layer and oxide superconducting layer can be formed by giving the heat treatment after coating the mixed solution of the octylic acid salt, the naphthenate, the neodecanoic acid salt, or the trifluoroacetate which include the element which composes the aforementioned intermediate layer and oxide superconducting layer with predefined mole ratio. And if these can be dissolved uniformly into one kind or more than two kinds of organic solvent and coated onto substrate, it is not limited by this example.

In this case, TFA-MOD method is preferable for the formation of the oxide superconducting layer. This method is known as the method of producing by the non-vacuum process. The solution of the metal organic acid salt including the trifluoroacetate (TFA salt) which includes each metallic element which composes the oxide superconductor with predefined mole ratio is coated onto the substrate, and the amorphous precursor is formed by giving the preliminary calcination heat-treatment to it, and then, the crystallization heat-treatment is given, and the oxide superconductor is formed by crystallizing the precursor.

As for the coating method to the metallic substrate, such spin coat method, dip coat method, or ink-jet method are enumerated. However, if the uniform film to the substrate can be formed, it is not limited by this example.

Although the in-plane orientation of the first intermediate layer 11 by MOD method is formed in the range of about −2 degrees-+5 degrees for Δφ (half value width) by the X-ray diffraction of the oriented metallic substrate 10 which has the biaxially-orientation, preferably, the in-plane orientations from the first intermediate layer to the third intermediate layer are maintained within the range of ±1.0 degree for Δφ (half value width) of the oriented metallic substrate 10 which has the biaxially-orientation.

It is preferable that the oxide superconducting layer which is formed onto the third intermediate layer has the structure of $RE_3Ba_2Cu_3O_{7-y}$ (here, $RE_3$ shows any one kind or more than two kinds of elements selected from Y, Gd, Sm, Nd, Ho, Dy, Eu, Tb, Er, or Yb). Particularly, it is preferable that it is formed by an $YBa_2Cu_3O_{7-y}$ (hereinafter called, YBCO) superconductor.

From the above, as more preferable embodiment of the tape-shaped oxide superconductor of this invention, onto the surface layer of the Ni-base alloy which includes any one kind or more than two kinds of elements selected from (W, Mo, Ta, V, Cr) into Ni, and which is provided with the biaxially-oriented surface layer at the face of at least one side, the three-layer structured intermediate layer that the first intermediate layer, the second intermediate layer, and the third intermediate layer are formed in series is provided. The first intermediate layer is formed by $CeO_2$ which is formed by the organic metallic salt coating thermal decomposition (MOD) method whose thickness is 10-100 nm or by Ce—Gd—O oxide whose mole ratio is within the range of Ce:Gd=40:60-70:30, the second intermediate layer is formed by Ce—Er—O oxide which is formed by the organic metallic salt coating thermal decomposition (MOD) method whose thickness is 30 nm or more and whose mole ratio is within the range of Ce:Gd=30:70-70:30, and the third intermediate layer is formed by $CeO_2$ whose thickness is 30 nm or more or by Ce—Gd—O oxide whose mole ratio is within the range of Ce:Gd=40:60-70:30. And the in-plane orientation from the first intermediate layer to the third intermediate layer can be maintained within the range of ±1.0 degree for $\Delta\phi$ (half value width) by the X-ray diffraction of the biaxially-oriented metallic substrate, and YBCO oxide superconductor can be formed by the organic metallic salt coating thermal decomposition (MOD) method onto this intermediate layer.

Embodiment

Hereinafter, the embodiments of this invention and the comparative examples are explained.

EXAMPLE 1-8

Figure 1:
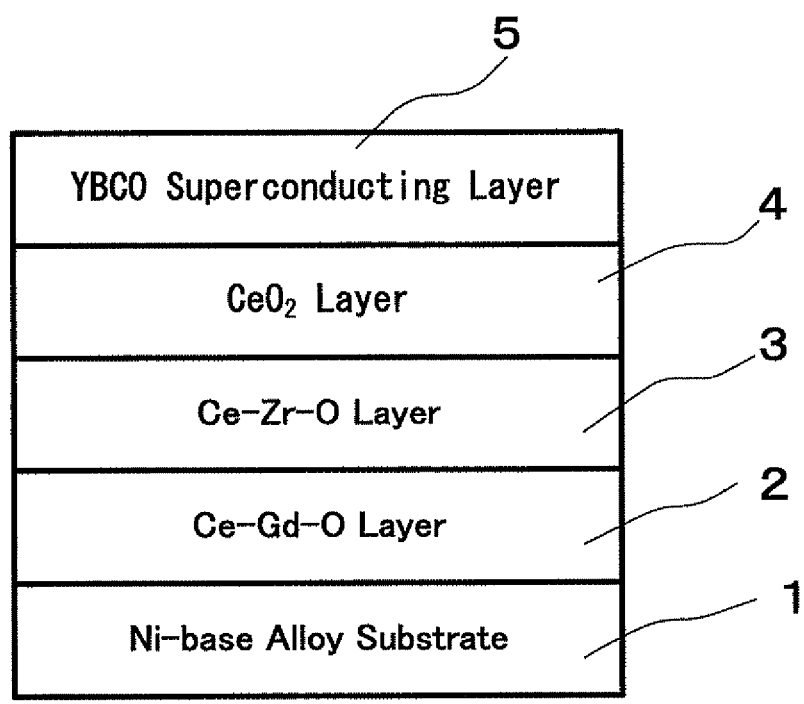
[FIG. 1] The schematic sectional view which is perpendicular to the axial direction of the tape which shows one embodiment of the tape-shaped oxide superconductor of this invention.

As shown in FIG. 1, onto the Ni-base alloy substrate of the width of 5 mm and the thickness of 70 μm, Ce—Gd—O system oxide layer 2 as the first intermediate layer and Ce—Zr—O system oxide layer 3 as the second intermediate layer were formed by MOD method. As the result of measurement by X-ray diffraction, the orientation of the crystalline of the Ni-base alloy substrate 1 was 6.5 degrees in the $\Delta\phi$ (half value width).

Ce—Gd—O system oxide layer 2 was formed by carrying out the preliminary calcination in the range of 100-400 degrees C. after coating the mixed solution of the organic metallic salt such as the octylic acid, the naphthenic acid or the neodecanoic acid which includes Ce and Gd with pre-defined mole ratio respectively by using the Dip coating, and then by crystallizing the film by giving the baking in the range of 900-1200 degrees C.

Besides, Ce—Zr—O system oxide layer 3 was formed as the film onto Ce—Gd—O system oxide layer 2 by using the mixed solution of the organic metallic salt such as the octylic acid, the naphthenic acid or the neodecanoic acid which includes Ce and Zr with the mole ratio of Ce:Zr=50:50, and by the method similar to the above-mentioned. The film thickness at this time was 100 nm.

Onto the above-mentioned Ce—Zr—O system oxide layer 3, by RF sputtering method, the film of $CeO_2$ oxide layer 4 of the film thickness of 150 nm was formed as the third intermediate layer by using the $CeO_2$ target and by controlling the Ni-base alloy substrate 1 with the range of the temperature of 400-750 degrees C.

Onto the three-layer structured intermediate layer which was formed by the above-mentioned, the film of YBCO superconducting layer 5 was formed by TFA-MOD method. As for the condition of the film formation at this time, after coating the mixed raw material solution of the metal organic acid salt which includes the trifluoroacetate (TFA salt) onto $CeO_2$ oxide layer 4, the film was formed with the range of the temperature of 710-780 degrees C. by carrying out the normal calcination of the preliminary calcination film which was formed by the preliminary calcination. The range of the whole pressure at the time of the calcination was 5-800 Torr., the oxygen partial pressure was 100-5000 ppm, and the water vapor partial pressure was 2-30%. The film thickness of YBCO superconducting layer 5 which was formed in this way was 1 μm.

As for the Jc of the tape-shaped oxide superconductor which was formed by the above-mentioned in the liquid nitrogen, the composition, the film thickness, and the $\Delta\phi$ of the Ce—Gd—O system oxide layer 2 which is the first intermediate layer, the $\Delta\phi$ of the Ce—Zr—O system oxide layer 3 which is the second intermediate layer, and the $\Delta\phi$ of the $CeO_2$ oxide layer 4 which is the third intermediate layer were shown together in the table 1.

TABLE 1

| | First intermediate layer | | $\Delta\phi$ (Half value width: degree) | | | |
| --- | --- | --- | --- | --- | --- | --- |
| Example | Ce:Gd (Mole ratio) | Film thickness (nm) | First intermediate layer | Second intermediate layer | Third intermediate layer | Jc of YBCO film (MA/cm$^2$) |
| 1 | 50:50 | 15 | 6.0 | 6.1 | 6.0 | 2.1 |
| 2 | 50:50 | 50 | 6.2 | 6.0 | 6.0 | 2.2 |
| 3 | 50:50 | 75 | 6.2 | 6.3 | 6.2 | 2.1 |
| 4 | 50:50 | 100 | 6.4 | 6.2 | 6.2 | 2.1 |
| 5 | 60:40 | 50 | 6.5 | 6.6 | 6.6 | 1.8 |
| 6 | 70:30 | 50 | 6.5 | 6.4 | 6.3 | 2.0 |
| 7 | 90:10 | 50 | 6.4 | 6.4 | 6.4 | 1.9 |
| 8 | 40:60 | 50 | 6.3 | 6.4 | 6.3 | 1.8 |

Note)
First intermediate layer: Ce—Gd—O system oxide layer
Second intermediate layer: Ce—Zr—O system oxide layer
Third intermediate layer: $CeO_2$ oxide layer

EXAMPLE 9-12

The tape-shaped oxide superconductor was formed by the method similar to Embodiment 1-8 except that the $CeO_2$ oxide layer (Embodiment 9), Ce—Sm—O oxide layer (Embodiment 10), Ce—Eu—O oxide layer (Embodiment 11), and Ce—Ho—O oxide layer (Embodiment 12) as the first intermediate layer was formed.

As for the Jc of the tape-shaped oxide superconductor which was formed in this way in the liquid nitrogen, the composition, the film thickness, and the $\Delta\phi$ of the first intermediate layer, the $\Delta\phi$ of the Ce—Zr—O system oxide layer 3 which is the second intermediate layer, and the $\Delta\phi$ of the $CeO_2$ oxide layer 4 which is the third intermediate layer were shown together in the table 2.

TABLE 2

| | First intermediate layer | | | $\Delta\phi$ (Half value width: degree) | | | |
| --- | --- | --- | --- | --- | --- | --- | --- |
| Example | Oxide | $Ce:Re_1$ (Mole ratio) | Film thickness (nm) | First intermediate layer | Second intermediate layer | Third intermediate layer | Jc of YBCO film (MA/cm$^2$) |
| 9 | $CeO_2$ | 100:0 | 50 | 6.5 | 6.5 | 6.4 | 1.7 |
| 10 | Ce—Sm—O | 50:50 | 50 | 6.7 | 6.6 | 6.7 | 1.7 |
| 11 | Ce—Eu—O | 50:50 | 50 | 6.7 | 6.8 | 6.7 | 1.6 |
| 12 | Ce—Ho—O | 50:50 | 50 | 6.8 | 7.0 | 7.0 | 1.6 |

Note)
Second intermediate layer: Ce—Zr—O system oxide layer
Third intermediate layer: $CeO_2$ oxide layer

COMPARATIVE EXAMPLE 1-4

As the first intermediate layer, Ce—Gd—O system oxide layer (Comparative example 1 to 3) whose composition and film thickness were changed was formed, and further, the tape-shaped oxide superconductor was formed by the method similar to Embodiment 1-8 except the case (Comparative example 4) that the first intermediate layer was not formed onto the Ni-base alloy substrate 1.

As the Jc of the tape-shaped oxide superconductor which was formed in this way in the liquid nitrogen, the composition, the film thickness, and the $\Delta\phi$ of the first intermediate layer, the $\Delta\phi$ of the Ce—Zr—O system oxide layer 3 which is the second intermediate layer, and the $\Delta\phi$ of the $CeO_2$ oxide layer 4 which is the third intermediate layer were shown together in the table 3.

TABLE 3

| | First intermediate layer | | | $\Delta\phi$ (Half value width: degree) | | | |
| --- | --- | --- | --- | --- | --- | --- | --- |
| Comparative example | Oxide | $Ce:Re_1$ (Mole ratio) | Film thickness (nm) | First intermediate layer | Second intermediate layer | Third intermediate layer | Jc of YBCO film (MA/cm$^2$) |
| 1 | Ce—Gd—O | 50:50 | 5 | Measurement is not possible | 9.0 | 9.0 | 0.7 |
| 2 | Ce—Gd—O | 50:50 | 120 | 7.0 | 8.5 | 8.5 | 0.8 |
| 3 | Ce—Gd—O | 20:80 | 50 | 10.0 | 10.0 | 10.0 | 0.6 |
| 4 | None | — | — | — | 8.5 | 8.5 | 1.0 |

Note)
Second intermediate layer: Ce—Zr—O system oxide layer
Third Intermediate layer: $CeO_2$ oxide layer Industrial Applicability In the tape-shaped oxide superconductor according to this invention, the utilization to the oxide superconductor which is suitable to the usages to the electric power cable, the electric power equipment such as the electric power storage system and the power equipment such as the motor is possible.

The invention claimed is:

1. A tape-shaped oxide superconductor having an intermediate layer and an oxide superconducting layer provided in series onto a biaxially-oriented metallic substrate, comprising:

a three-layer structured intermediate layer including
a first intermediate layer which is formed onto said metallic substrate and comprises an oxide which has a template function, a second intermediate layer which is formed onto said first intermediate layer and comprises an oxide which has a function which prevents diffusion to said oxide superconducting layer of an element which composes said metallic substrate, and a third intermediate layer which is formed onto said second intermediate layer and comprises an oxide which has a function which controls an orientation of said oxide superconducting layer; and wherein the first intermediate layer is Ce—$RE_1$—O, wherein $RE_1$ is at least one element selected from the group consisting of Gd, Sm, Eu, Dy, Ho, and Er, and wherein a mole ratio of Ce:$RE_1$ of the first intermediate layer is within the range of Ce:$RE_1$=40:60-70:30 and the third intermediate layer is $CeO_2$.

2. A tape-shaped oxide superconductor according to claim 1,
wherein in-plane orientations from the first intermediate layer to the third intermediate layer are within the range of ±1.0 degree for Δφ (half value width) by X-ray diffraction of the biaxially-oriented metallic substrate.

3. A tape-shaped oxide superconductor according to claim 1,
wherein the first intermediate layer has a thickness within the range of 10-100 nm.

4. A tape-shaped oxide superconductor according to claim 1,
wherein the third intermediate layer has a thickness of 30 nm or more.

5. A tape-shaped oxide superconductor according to claim 1,
wherein the oxide superconducting layer has a structure of $RE_3Ba_2Cu_3O_{7-y}$, wherein $RE_3$ is at least one element selected from the group consisting of Y, Gd, Sm, Nd, Ho, Dy, Eu, Tb, Er, and Yb.

6. A tape-shaped oxide superconductor according to claim 1,
wherein the second intermediate layer is formed by $RE_2$—Zr—O, wherein $RE_2$ is at least one element selected from the group consisting of Ce, Gd, Sm, Eu, Dy, Ho, Er, and Y.

7. A tape-shaped oxide superconductor according to claim 6,
wherein a mole ratio of $RE_2$:Zr of the second intermediate layer is within the range of $RE_2$:Zr=30:70-70:30.

8. A tape-shaped oxide superconductor according to claim 7,
wherein the second intermediate layer has a thickness within the range of 30 nm or more.

9. A tape-shaped oxide superconductor according to claim 1,
wherein the first and the second intermediate layers and the oxide superconducting layer are formed by an organic metallic salt coating thermal decomposition (MOD).

10. A tape-shaped oxide superconductor according to claim 9,
wherein the first and the second intermediate layers and the oxide superconducting layer are formed by giving a heat-treatment after coating a mixed solution of an octylic acid salt, a naphthenate, a neodecanoic acid salt, or a trifluoroacetate which includes an element which composes the intermediate layer or the oxide superconducting layer.

11. A tape-shaped oxide superconductor according to claim 1,
wherein the biaxially-oriented metallic substrate is provided with a biaxially-oriented surface layer on a side which contacts at least the first intermediate layer.

12. A tape-shaped oxide superconductor according to claim 11,
wherein the biaxially-oriented metallic substrate is provided with a biaxially-oriented surface layer on a side which contacts at least the first intermediate layer by giving a heat-treatment after a cold rolling of Ni, Ni-base alloy, Cu, or Cu-base alloy.

13. A tape-shaped oxide superconductor according to claim 12,
wherein the biaxially-oriented metallic substrate comprises the Ni-base alloy which includes Ni and 0.1-15 at % of at least one element selected from the group consisting of W, Mo, Ta, V, and Cr.

14. A tape-shaped oxide superconductor, comprising:
a three-layer structured intermediate layer including a first intermediate layer, a second intermediate layer, and a third intermediate layer formed in series on a surface layer of Ni-base alloy which includes Ni and at least one element selected from the group consisting of W, Mo, Ta, V, and Cr and which is provided with a biaxially-oriented surface layer at least at a face of one side,
said first intermediate layer being Ce—Gd—O which is formed by an organic metallic salt coating thermal decomposition (MOD) and wherein a mole ratio of Ce:Gd is within the range of 40:60-70:30, said first intermediate layer having a thickness of 10-100 nm,
said second intermediate layer being Ce—Zr—which is formed by the organic metallic salt coating thermal decomposition (MOD), said second intermediate layer having a thickness of 30 nm or more and a mole ratio Ce:Zr within the range of 30:70-70:30,
said third intermediate layer being $CeO_2$ and having a thickness of 30 nm or more,
wherein the first intermediate layer to the third intermediate layer have in-plane orientations within the range of ±1.0 degree for Δφ (half value width) by a X-ray diffraction of a biaxially-oriented metallic substrate, and
wherein an $YBa_2Cu_3O_{7-y}$ superconducting layer, formed by organic metallic salt coating thermal decomposition (MOD), is superimposed on the three-layered structured intermediate layer.

* * * * *